US007767587B2

(12) United States Patent
Fuller et al.

(10) Patent No.: US 7,767,587 B2
(45) Date of Patent: Aug. 3, 2010

(54) METHOD OF FORMING AN INTERCONNECTION STRUCTURE IN A ORGANOSILICATE GLASS HAVING A POROUS LAYER WITH HIGHER CARBON CONTENT LOCATED BETWEEN TWO LOWER CARBON CONTENT NON-POROUS LAYERS

(75) Inventors: Nicholas C. M. Fuller, Elmsford, NY (US); Timothy J. Dalton, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 12/034,692

(22) Filed: Feb. 21, 2008

(65) Prior Publication Data
US 2008/0146037 A1 Jun. 19, 2008

Related U.S. Application Data

(62) Division of application No. 10/845,718, filed on May 14, 2004, now Pat. No. 7,504,727.

(51) Int. Cl.
*H01L 21/28* (2006.01)
*H01L 21/47* (2006.01)

(52) U.S. Cl. ............... 438/740; 438/624; 438/638; 438/714; 438/725; 257/E21.579

(58) Field of Classification Search ............... 438/723, 438/725, 737, 738, 622–624, 638, 714, 740, 438/790; 257/E21.579
See application file for complete search history.

(56) References Cited

U.S. PATENT DOCUMENTS

| | | |
|---|---|---|
| 6,147,009 A | 11/2000 | Grill et al. |
| 6,171,945 B1 | 1/2001 | Mandal et al. |
| 6,348,158 B1 * | 2/2002 | Samukawa ............ 216/67 |
| 6,413,846 B1 | 7/2002 | Besser et al. |
| 6,441,491 B1 | 8/2002 | Grill et al. |
| 6,475,929 B1 | 11/2002 | Gabriel et al. |
| 6,479,110 B2 | 11/2002 | Grill et al. |
| 6,497,963 B1 | 12/2002 | Grill et al. |
| 6,573,196 B1 | 6/2003 | Gaillard et al. |
| 6,583,048 B1 | 6/2003 | Vincent et al. |
| 6,605,540 B2 | 8/2003 | Ali et al. |
| 6,617,208 B2 | 9/2003 | Saran |
| 6,713,402 B2 | 3/2004 | Smith et al. |
| 6,713,873 B1 | 3/2004 | O'Loughlin et al. |
| 6,720,249 B1 | 4/2004 | Dalton et al. |
| 6,784,107 B1 | 8/2004 | Chen et al. |
| 6,908,846 B2 | 6/2005 | McMillin et al. |
| 6,913,994 B2 | 7/2005 | Guo et al. |
| 6,914,004 B2 | 7/2005 | Thompson |

(Continued)

*Primary Examiner*—Anh D Mai
(74) *Attorney, Agent, or Firm*—Scully, Scott, Murphy & Presser, P.C.; Louis J. Percello, Esq.

(57) ABSTRACT

Interconnect structures possessing a non-porous (dense) low-k organosilicate glass (OSG) film utilizing a porous low-k OSG film as an etch stop layer or a porous low-k OSG film using a non-porous OSG film as a hardmask for use in semiconductor devices are provided herein. The novel interconnect structures are capable of delivering improved device performance, functionality and reliability owing to the reduced effective dielectric constant of the stack compared with that of those conventionally employed and also because of the relatively uniform line heights made feasible by these unique and seemingly counterintuitive features. The present invention also provides a fluorocarbon-based dual damascene etch process that achieves selective etching of a dense low-k OSG films relative to that of a porous low-k OSG film owing to the tunability of the gas-phase fluorine:carbon ratio (gas dissociation) and ion current below a critical threshold and given the larger carbon content of the porous film relative to that of the dense film.

8 Claims, 5 Drawing Sheets

U.S. PATENT DOCUMENTS

| | | |
|---|---|---|
| 6,919,636 B1 | 7/2005 | Ryan |
| 2002/0064940 A1 | 5/2002 | Steiner et al. |
| 2003/0201539 A1 | 10/2003 | Matsunaga et al. |
| 2004/0061236 A1 | 4/2004 | Koide |
| 2004/0157453 A1 | 8/2004 | Delgadino et al. |
| 2004/0232537 A1 | 11/2004 | Kobrinsky et al. |
| 2005/0104150 A1 | 5/2005 | Wetzel et al. |
| 2005/0106848 A1 | 5/2005 | Bailey et al. |
| 2005/0158999 A1 | 7/2005 | Lin et al. |
| 2005/0167839 A1 | 8/2005 | Wetzel et al. |

* cited by examiner

METHOD OF FORMING AN INTERCONNECTION STRUCTURE IN A ORGANOSILICATE GLASS HAVING A POROUS LAYER WITH HIGHER CARBON CONTENT LOCATED BETWEEN TWO LOWER CARBON CONTENT NON-POROUS LAYERS

RELATED APPLICATIONS

This application is a divisional of U.S. patent application Ser. No. 10/845,718, filed May 14, 2004.

FIELD OF THE INVENTION

The present invention generally relates to semiconductor integrated circuits (ICs), and more particularly to semiconductor interconnect structures, including multilevel interconnect structures, in which advanced dual damascene processing enables using a porous low-k dielectric material as an etch stop layer (ESL) for a non-porous (dense) low-k dielectric film, or using a non-porous (dense) low-k dielectric film as a hardmask for a porous low-k dielectric material. The term "low-k" is used throughout the present application to denote an insulator having a dielectric constant of less than silicon dioxide, i.e., less than about 4.0. All dielectric constant values are measured in a vacuum unless otherwise specified herein.

BACKGROUND OF THE INVENTION

Currently, semiconductor devices include a plurality of circuits, which form an integrated circuit (IC) including chips (e.g., chip back end of line, or "BEOL"), thin film packages and printed circuit boards. Integrated circuits can be useful for computers and electronic equipment and can contain millions of transistors and other circuit elements that are fabricated on a single silicon crystal substrate. For the device to be functional, a complex network of signal paths will normally be routed to connect the circuit elements distributed on the surface of the device. Efficient routing of these signals across the device can become more difficult as the complexity Efficient routing of these signals across the device can become more difficult as the complexity and number of integrated circuits are increased. Thus, the formation of multilevel or multilayered interconnection schemes such as, for example, dual damascene wiring structures, have become more desirable due to their efficacy in providing high speed signal routing patterns between large numbers of transistors on a complex semiconductor chip. Within the interconnection structure, metal vias run perpendicular to the silicon substrate and metal lines run parallel to the silicon substrate.

Presently, interconnect structures formed on an integrated circuit chip consists of at least about 2 to 8 wiring levels (See, for example, FIG. 1) fabricated at a minimum lithographic feature size designated about 1× (referred to as "thinwires") and above these levels are about 2 to 4 wiring levels fabricated at a width equal to about 2× and/or about 4× the minimum width of the thinwires (referred to as "fatwires"). In one class of structures, the thinwires are formed in a low dielectric constant (k) organosilicate glass (OSG) dielectric layer, and the fatwires are made in a silicon dioxide dielectric layer having a dielectric constant of about 4. The OSG typically contains elements of Si, C, O and H, and is sometimes referred to as SiCOH dielectrics. These dielectrics have a dielectric constant that is below 4.0, typically the dielectric constant of OSG dielectrics is between 2.8-3.1.

In typical trench or via-first integration strategies, one of the challenges during the creation of the line level structure in dual damascene processing is to minimize line height variations (and hence line resistance variance) within a wafer and within a lot. These line height variations can arise owing to occasional etch rate non-uniformities within the employed plasma process dependent on pattern density and/or feature aspect ratio variations or due to variations in the interlevel dielectric (ILD) film thickness. To compensate for such effects, an etch stop layer (ESL) for line levels ($M_{x+1}$ levels, where x is a positive integer) can be desirable for maintaining within wafer and within lot uniformity such that line resistance values are within design manual specifications with minimal variability; thus enabling a more manufacturable process.

Typical ESLs employed for alleviating such effects include various permutations of SiC ($SiCN_xH_y$) or $Si_3N_4$ (SiON) are of higher dielectric constant ($k \geq 5.0$) than that of the ILD materials employed for 90 nm back-end-of-the-line (BEOL) technologies (k of approximately 2.8 to 3.1); thus, though addressing the issue of line height uniformity and line level resistance variance, prior art ESLs decrease overall device performance by increasing the effective dielectric constant, $k_{eff}$, of the structure.

In addition to the above problem concerning prior art ESLs, there is an ongoing trend of replacing traditional ILDs with low-k dielectrics that are porous. The use of porous ILD materials for 65 nm and subsequent BEOL technologies also introduces the concept of line height control and consequent variance in metal line resistances. Since typically BEOL processing conditions would etch a low-k dielectric hardmask faster than the underlying porous low-k material, the issue in line height control and resistance variation is perhaps made even more severe for these technologies.

In view of the above drawbacks with prior art interconnect structures, there is a need for providing new and improved interconnect structures in which the line height variation and hence the line resistance variance is minimized.

SUMMARY OF THE INVENTION

The present invention provides a BEOL interconnect structure, e.g., a dual damascene interconnect structure, in which a porous organosilicate glass (OSG) comprising elements of Si, C, H and O is employed as an etch stop layer for non-porous (dense) OSG interlevel dielectrics. The OSG material is a hydrogenated oxidized silicon carbon material also referred to in the art as a carbon doped oxide. The present invention also provides a BEOL structure in which a non-porous (dense) OSG dielectric is employed as a hardmask for a porous OSG interlevel dielectric. The porous and non-porous OSG dielectrics employed in the present invention are both low-k dielectrics.

In accordance with the present invention, the BEOL interconnect structures of the present invention have minimized line height variation and minimal line resistance variation. More particularly, the inventive BEOL interconnect structures have improved device functionality and performance due to the reduced effective dielectric constant, $k_{eff}$, of the overall BEOL stack compared with conventionally employed BEOL stacks.

In one aspect of the present invention, the interconnect structure comprises a porous organosilicate glass etch stop layer located between first and second non-porous organosilicate glass interlevel dielectrics, said porous organosilicate glass having a carbon content that is greater than the carbon content present in said first and said second non-porous organosilicate glass interlevel dielectrics.

In another aspect of the present invention, the BEOL interconnect structure comprises at least one porous organosilicate glass interlevel dielectric and a non-porous organosilicate glass hardmask located on a surface thereof, said at least one porous organosilicate glass interlevel dielectric having a carbon content that is greater than the carbon content in said non-porous organosilicate glass hardmask.

In addition to the above mentioned BEOL interconnect structures, the present invention also provides methods to fabricate such structures. In broad terms, one method of the present invention comprises the steps of:

providing a structure comprising a porous organosilicate glass etch stop layer located between a first non-porous organosilicate glass interlevel dielectric and a second non-porous organosilicate glass interlevel dielectric, said porous organosilicate glass having a carbon content that is greater than the carbon content in the first and second non-porous organosilicate glass interlevel dielectrics; and patterning said structure to provide an opening that extends through the structure, said patterning comprising lithography and etching, wherein said etching is performed in a fluorocarbon-based plasma having a fluorine to carbon ratio and at an ion current that selectively etches the non-porous organosilicate glass interlevel dielectrics relative to the porous organosilicate glass.

Following patterning, a conductive metal or metal alloy can be formed within the opening providing a conductively filled region within the patterned structure.

Another method of the present invention comprises the steps of:

providing a structure comprising a non-porous organosilicate hardmask located on a porous organosilicate glass interlevel dielectric, said porous organosilicate glass having a carbon content that is greater than the carbon content in the non-porous organosilicate glass; and patterning said structure to provide an opening in the structure, said patterning comprising lithography and etching, wherein said etching is performed in a fluorocarbon-based plasma having a fluorine to carbon ratio and at an ion current that selectively etches the non-porous organosilicate glass hardmask relative to the porous organosilicate glass interlevel dielectric.

Following patterning, a conductive metal or metal alloy can be formed within the opening providing a conductively filled region within the patterned structure.

BRIEF DESCRIPTION OF THE DRAWINGS

FIGS. 3A-3B are pictorial representations (through cross sectional views) of a dual damascene structure built in a porous low-k organosilicate glass dielectric material employing a trilayer resist scheme in which FIG. 3A is post lithography structure and FIG. 3B is a post partial etch structure.

DETAILED DESCRIPTION OF THE INVENTION

Figure 1:
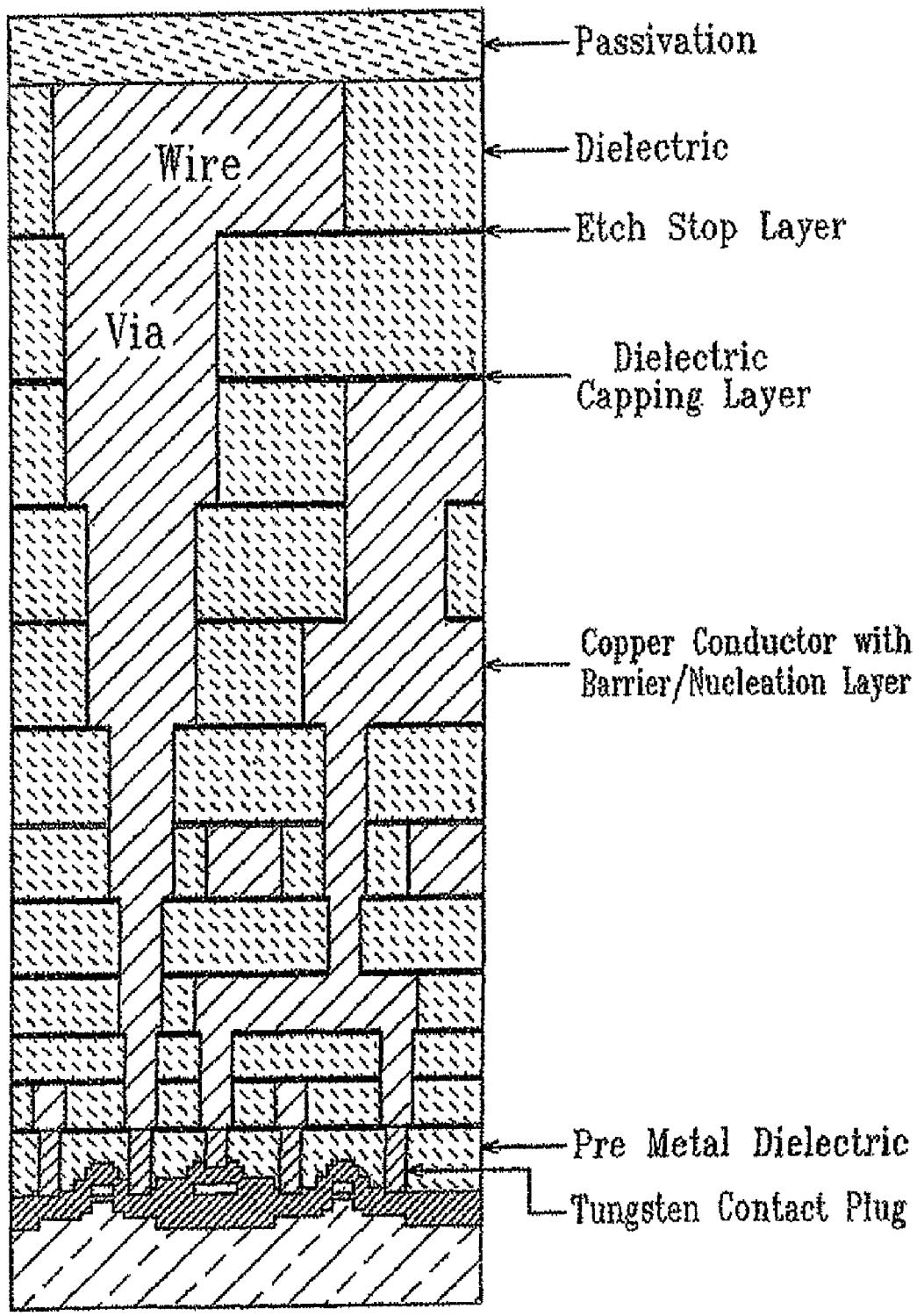
FIG. 1 is a pictorial representation (through a cross sectional view) showing a prior art 5 level metal interconnect structure.
Figure 2:
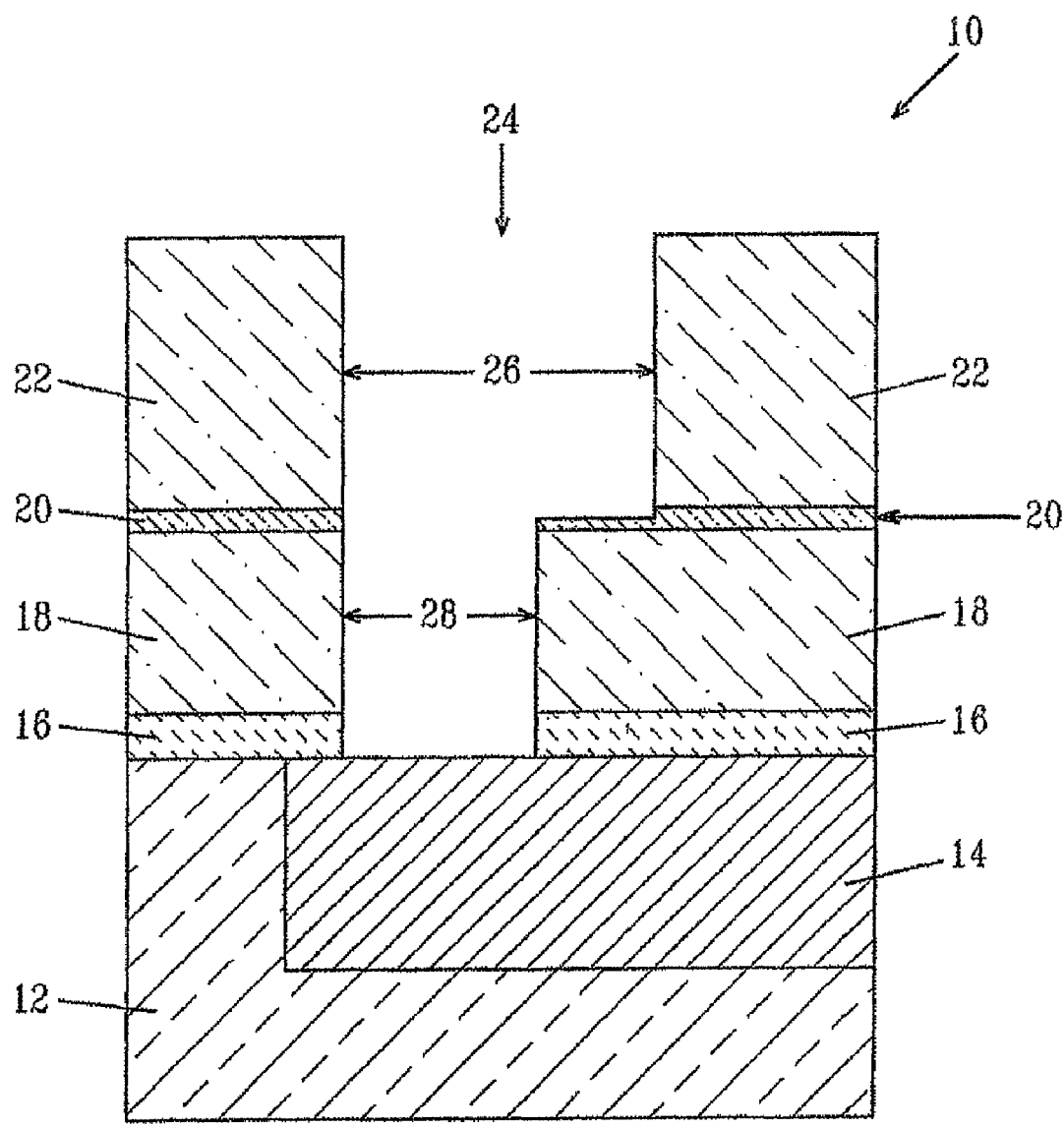
FIG. 2 is a pictorial representation (through a cross sectional view) showing a pre-metalized dual damascene interconnect structure built in a non-porous (dense) organosilicate glass material with a trench-level ($M_{x+1}$) porous etch stop layer.

The present invention, which provides interconnect structures possessing a non-porous (dense) low-k organosilicate glass (OSG) film utilizing a porous low-k OSG film as an etch stop layer or a porous low-k OSG film using a non-porous OSG film as a hardmask, as well as methods for fabricating such structures, will now be described in greater detail by referring to FIGS. 2-4 that accompany the present application. It should be noted that the dual-damascene structures shown in FIGS. 2 and 3A-3B are not drawn to scale. Moreover, these structures are provided for illustrative purposes only. Hence, the present invention is not limited to the interconnect structure specifically shown. Instead, the present invention can be used in forming any interconnect structure that is known in the art.

Reference is first made to FIG. 2 which shows a pre-metallization dual damascene interconnect structure 10 that includes substrate 12 having a conductive metal region 14 formed therein, and a dielectric cap 16 located on top of substrate 12 and conductive region 14. The interconnect structure 10 also includes a first non-porous OSG interlevel dielectric 18 located atop the dielectric cap 16, a porous OSG etch stop layer 20 located atop the first non-porous OSG interlevel dielectric 18, a second non-porous OSG interlevel dielectric 22 located atop the porous OSG etch stop layer 20 and at least one opening 24. As shown, opening 24 extends through the second porous OSG interlevel dielectric 22, the porous OSG etch stop layer 20, the first non-porous OSG interlevel dielectric 18, and dielectric cap 16, stopping on an upper surface of conductive region 14.

In accordance with both embodiments of the present invention, the porous OSG material has a carbon content that is greater than the non-porous OSG material. Typically, the porous OSG material has a carbon content from about 8 to about 18 atomic %, whereas the non-porous OSG has a carbon content from about 8 to about 13 atomic percent. More typically, the porous OSG has a carbon content from about 12 to about 15 atomic %, whereas the non-porous OSG has a carbon content from about 9 to about 11 atomic percent.

The substrate 12 of interconnect structure 10 may include any conventional material in which a conductive region can be formed. Thus, for example, substrate 12 may be a dielectric material such as an inorganic or organic, porous or non-porous, dielectric, or a semiconductor substrate such as Si, SiGe, GaAs, InAs, SiC, SiGeC, InP and other III/V or II/VI compound semiconductors. Substrate 12 can also be a silicon-on-insulator (SOI), a silicon germanium-on-insulator (SGOI) or any other layered semiconductor material. When a semiconductor substrate is employed as substrate 12, the substrate 12 may include various circuits and/or devices. For clarity, the circuits and/or devices are not shown in FIG. 2.

The conductive region 14 comprises at least one conductive metal. The term "conductive metal" includes, but is not limited to: metals such as aluminum (Al), copper (Cu), tungsten (W), silver (Ag) and other like metals that are electrically conductive and are used in interconnect structures. Alloys of these conductive metals such as Al—Cu are also contemplated herein. A preferred metal for conductive region 14 is Cu.

The conductive region 14 is formed utilizing conventional processing that is well known in the art, including, for example, lithography, etching and trench fill. The trench fill step includes a deposition process such as, for example, chemical vapor deposition (CVD), plasma-assisted CVD, plating, sputtering, chemical solution deposition and other like deposition processes. A planarization process such as chemical-mechanical polishing (CMP) or grinding typically follows the trench fill process.

An optional liner material, not shown, can be formed within the etched trench prior to trench fill. The optional liner material prevents diffusion of the conductive metal into the dielectric layers. Some examples of such liners include, but are not limited to: TiN, TaN, Ti, Ta, W, WN, Cr, Nb and other like metal diffusion barrier liners and combinations thereof. The optional liner can be formed in the trench using well known deposition processes including, for example, CVD, plasma-assisted CVD, sputtering, plating and chemical solution deposition.

After providing the substrate 12 including conductive region 14, a dielectric cap 16 is formed atop the structure. Specifically, the dielectric cap 16 is formed atop exposed surfaces of both substrate 12 and conductive region 14. The dielectric cap 16, which serves as a diffusion barrier in the inventive interconnect structure, is formed in the present invention utilizing a conventional deposition process including, for example, CVD, plasma-assisted CVD, evaporation, spin-on deposition, chemical solution deposition and the like. The dielectric cap 16 may comprise an inorganic dielectric such as an oxide, nitride, oxynitride or carbide, or dielectric cap 16 may comprise an organic dielectric having a dielectric constant below 4.0. Examples of organic materials that can be employed as dielectric cap 16 include, but are not limited to: polyarylenes. In some embodiments of the present invention, dielectric cap 16 is omitted. In embodiments in which dielectric cap 16 is present, the dielectric cap 16 typically has a deposited thickness from about 25 to about 50 nm.

Next, first non-porous OSG 18, porous OSG layer 20 and second non-porous OSG layer 22 are formed. The porous OSG layer 20, which in accordance with the present invention has a higher carbon content than the non-porous OSG layers 18 and 22, serves as an etch stop layer in the structure shown in FIG. 2. The pore size present in the porous OSG 20 may vary and is not critical to the present invention. Typically, and for illustrative purposes, the porous OSG etch stop layer 20 has a pore size ranging from 0.5 to about 8 nm at a volume percent from about 10 to about 50%.

The various OSG material layers are formed by any deposition technique such as CVD or plasma-enhanced CVD, in which at least a first precursor (gas, liquid or vapor) containing atoms of Si, C, O and H is employed. An optional second precursor (gas, liquid or vapor) comprising mainly atoms of Si, and C and optionally F, N and O can be employed. The first precursor utilized may be selected from one or more molecules containing at least atoms of Si, C, O and H. Oxidizing molecules such as $O_2$ or $N_2O$ can be added to the first precursor. Preferably the first precursor is a siloxane containing Si, C, O and H atoms, with cyclic siloxanes being especially preferred. Examples of some highly preferred first precursors include siloxanes selected from molecules with ring structures such as 1,3,5,7-tetramethylcyclotetrasiloxane (TMCTS or $C_4H_{16}O_4Si_4$), octamethylcyclotetrasiloxane (OMCTS, $C_8H_{24}O_4Si_4$), tetraethylcyclotetrasiloxane ($C_8H_{24}O_4Si_4$), decamethylcyclopentasiloxane ($C_{10}H_{30}O_5Si_5$), trimethylcyclotrisiloxane, hexamethylcyclotrisiloxane, molecules of methylsilanes mixed with an oxidizing agent such as $O_2$ or $N_2O$ or precursor mixtures including Si, O and C.

The second precursor is selected from the group comprising molecules with ring structures containing C and H atoms such as cyclic hydrocarbons, cyclic alcohols, cyclic ethers, cyclic aldehydes, cyclic ketones, cyclic esters, phenols, cyclic amines, or other O, N or F containing cyclic hydrocarbons. More preferably, the second precursor molecule is a multicyclic (or polycyclic) hydrocarbon containing about 6 to 12 carbon atoms, with preferably rings of 3 or more atoms. Preferred examples include 2,5-norbornadiene (also known as bicyclo[2.2.1]hepta-2,5-diene), norbornylene 2,5-norbornadiene (also known as bicyclo [2.2.1]hepta-2,5-diene), norbornane (also known as bicyclo[2.2.1]heptane). Other examples are tricyclo[3.2.1.0]octane, tricyclo[3.2.2.0]nonane, connected ring hydrocarbons such as spiro[3.4]octane, spirol[4.5]nonane, spiro[5.6]decane, and the like. Alternatively, cyclic hydrocarbons containing from 5 to 12 carbon atoms (cyclopentane, cyclohexane, and the like) and also cyclic aromatic hydrocarbons containing 6 to 12 C atoms (benzene, toluene, xylenes, and the like) may be used. Optionally, O or F atoms may be contained in the molecules, or molecules containing such atoms added to the precursor mixture.

Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics. Among the readily available examples of these, are 6-oxabicyclo[3.1.0]hexane or cyclopentene oxide (bp=102° C. at 760 mm Hg);

7-oxabicyclo[4.1.0]heptane or cyclohexene oxide (bp=129° C. at 760 mm Hg);

9-oxabicyclo[6.1.0]nonane or cyclooctene oxide (bp=55° C. at 5 mm Hg); and 7-oxabicyclo[2.2.1]heptane or 1,4-epoxycyclohexane (bp=119° C. at 713 mm Hg). One highly preferred fused ring species that is employed in the first embodiment of the present invention is cyclopentene oxide (CPO).

The second precursor can also include a siloxane selected from tetramethylorthosilicate (TMOS), tetraethylorthosilicate (TEOS), vinyltriethoxysilane, allyltrimethoxysilane, vinyltrimethoxysilane, allyltriethoxysilane, phenyltriethoxysilane, and phenyltrimethoxysilane.

The porous OSG material is formed by providing a pore forming material such as a porogen during deposition. Although any deposition technique can be used in forming the OSG materials, the techniques disclosed in co-assigned U.S. Pat. Nos. 6,147,009, 6,497,963, 6,312,793, 6,441,491 and 6,479,110, the entirety of each reference is incorporated herein by reference, are particularly preferred herein.

The various OSG dielectrics may be deposited within the same reactor chamber without the need of breaking vacuum, or the various OSG dielectrics may be deposited in separate reactor chambers.

The thickness of the non-porous OSG interlevel dielectrics 18 and 22 is greater than that of the porous OSG etch stop layer 20. Typically, the non-porous OSG dielectrics 18, 22 have a thickness from about 100 to about 500 nm, while the porous OSG etch stop layer 20 has a thickness from about 30 to about 150 nm.

After forming the various OSG dielectrics, at least one opening 24 is formed through layers 22, 20, 18 and 16 stopping on the conductive region 14. The at least one opening 24 formed in the second non-porous OSG dielectric 22 is typically wider than the opening formed in the first porous OSG dielectric 18. The wider opening formed in the second non-porous OSG ILD 22 is referred to herein as a line opening 26, while the narrower opening in the first non-porous OSG ILD 18 is referred to herein as a via opening 28.

The at least one opening 24 is formed by lithography and an etching process in which a fluorocarbon-based plasma having a fluorine to carbon ratio and at an ion current that selectively etches the non-porous organosilicate glass interlevel dielectrics relative to the porous organosilicate glass is employed. The term "fluorocarbon-based plasma" comprises any plasma that includes fluorine and carbon. One example of a fluorocarbon-based plasma employed in the present invention is a plasma that comprises $CF_4$ and $C_4F_8$. Other types of fluorocarbon-based plasmas, as discussed hereinbelow, are also contemplated herein.

The plasma which is generated using a plasma source from any conventional plasma etching platform can be admixed with an inert gas such as, for example, He, $N_2$, Ar, Xe, Ne and mixtures thereof. Reducing gaseous radicals and/or oxidizing gaseous radicals may be present in the fluorocarbon-based plasma as well. A gas-phase fluorine to carbon, F:C, ratio from about 1.5:1 to about 4:1 (assuming quasi-complete gas dissociation) is typically employed in the present invention, and the ion current of the etch tool is typically from about 1 to about 20 (relative units); where 1 denotes the threshold ion energy for ion enhanced (assisted) desorption (etching) of adsorbates from the dielectric surface to occur.

Specifically, in this embodiment of the present invention, the use of a porous OSG material having a carbon content that exceeds that of a non-porous OSG ILD facilitates the possibility of utilizing the porous OSG material as an etch stop layer by operating in a plasma processing regime that enables etching of the non-porous low-k film selective to the porous film. Such a unique and seemingly counterintuitive feature is made feasible in the present invention by preselecting (1) the gas-phase fluorine to carbon (F:C) ratio (degree of gas dissociation) and (2) the ion current incident on the wafer surface such that the non-porous OSG films is selectively etched as compared to the porous OSG film.

The proposed generic etch mechanism for OSG films, i.e., SiCOH, in a fluorocarbon-based plasma can be summarized by the following unbalanced equations:

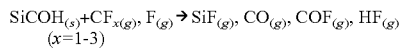
(x=1-3)

The role of gas phase carbon, as illustrated above, is to "scavenge" oxygen within the SiCOH film as various gaseous products; while carbon in the film is scavenged by some reducing ($N_2$ or $H_2$) or oxidizing ($O_2$) gaseous radicals. However, by tuning the gas-phase F:C ratio (degree of gas dissociation), one can essentially overwhelm the SiCOH film with various gaseous molecular carbon (CF, $CF_2$ etc) radicals such that all oxygen within the film is completely removed with the excess gaseous molecular carbon species remaining forming a SiC-like layer at the surface impeding further etching, i.e., inducing the so-called "etch stop" phenomenon. It is thus feasible, if the carbon content of the porous OSG material is greater than the carbon content in the non-porous OSG film to tune the gas-phase F:C ratio such that the non-porous film etches by the generic mechanism outlined in the above equations whereas the porous film undergoes so-called etch stop.

To enable this phenomenon, it is not sufficient to only have a reasonably low gas-phase F:C ratio (minimal gas dissociation), but additionally requires a minimal ion current (on the order of approximately the ion density x ion energy) incident on the wafer surface. Since conventionally employed porous OSG film's (k of approximately 2.2) are typically at least 30% fractionally porous; even if the gaseous F:C ratio is such that the film should undergo etch stop in theory; if the ion current to the wafer is such that sputtering of the SiC-type monolayer thick film at the surface of the porous low-k film exposes underlying pores, etching of the film will proceed at some finite rate. It is, thus, also necessary to tune the ion current to the wafer below a critical threshold such that etching of the non-porous film is still enabled whereas that of the porous film "ceases".

Typical plasma processing conditions on a commercial dual frequency capacitively-coupled BEOL etch platform that will achieve the above selective etching of a non-porous OSG film with respect to a porous OSG film are: 40 to 200 mTorr pressure; $150W_{27}$ to $450W_{27}$; (where $W_{27}$ and $W_2$ refer to the deposited power for 27 MHz and 2 MHz frequencies, respectively) 0 to $100W_2$; 50 to 200 sccm Ar; 50 to 200 sccm $N_2$; 3 to 8 sccm $C_4F_8$; 5 to 20 sccm $CF_4$. More typical ranges for these parameters are: 50 to 90 mTorr pressure; $250W_{27}$ to $350W_{27}$; 0 to $50W_2$; 75 to 125 sccm Ar; 50 to 150 sccm $N_2$; 4 to 6 sccm $C_4F_8$; and 5 to 15 sccm $CF_4$. Etch selectivities on the order of 4.4 to 3.0:1 are achieved within these processing conditions. The tolerance in each of these parameters for achieving such selectivity values are given in Table I below coupled with the potential function of each of these parameters.

TABLE I

| Plasma Parameter | Tolerance Range | Function |
|---|---|---|
| 27 MHz Power (W) | 200 to 400 | Gas-Phase FC Ratio/Ion Current |
| 2 MHz Power (W) | <100 | Ion Current |
| Pressure (mT) | 70 to 140 | Gas-Phase FC Ratio/Ion Current |
| $C_4F_8$ Flow (sccm) | 4 to 10 | Gas-Phase FC Ratio |
| $CF_4$ Flow (sccm) | 7 to 20 | Gas-Phase FC Ratio |
| Ar | 50 to 200 | Ion Current |

It is significant to note, though not demonstrated here, that other mono- and poly-carbon-type fluorocarbon molecules can potentially achieve similar selectivities of etching a non-porous SiCOH film (k~2.8 to 3.1) selective to a porous SiCOH film (k≦2.2); namely the replacement of $CF_4$ with $CHF_3$, $CH_2F_2$, $CH_3F$, or combinations of these and the replacement of $C_4F_8$ with $C_4F_6$, or $C_5F_8$, or $C_2F_6$, $C_3F_6$, or combinations of these.

After etching, a conductive metal, which can be the same or different material as conductive region 14 is formed in the at least one opening 24. A preferred metal for filling the opening 24 is Cu. The conductive metal is formed within the at least one opening 24 utilizing a conventional trench fill process such as chemical vapor deposition (CVD), plasma-assisted CVD, plating, sputtering, chemical solution deposition and other like deposition processes. A planarization process such as chemical-mechanical polishing (CMP) or grinding typically follows the trench fill process.

An optional liner material, not shown, can be formed within the etched trench prior to trench fill. The optional liner material prevents diffusion of the conductive metal into the dielectric layers. Some examples of such liners include, but are not limited to, TiN, TaN, Ti, Ta, W, WN, Cr, Nb and other like metal diffusion barrier liners and combinations thereof. The optional liner can be formed in the trench using well known deposition processes including, for example, CVD, plasma-assisted CVD, sputtering, plating and chemical solution deposition.

The corollary of the first embodiment mentioned above is the use of a dense low-k OSG dielectric as a hardmask layer for dual damascene built in a porous low-k OSG material. In this embodiment of the present invention, the porous OSG has a C content that also exceeds that of the non-porous OSG. The potential use of porous low-k OSG materials for 65 nm and subsequent BEOL technologies also introduces the concept of line height control and consequent line resistance variance. Since typical processing conditions would etch the dense low-k OSG dielectric hardmask faster than the underlying porous low-k OSG material; this issue is perhaps made even more severe for these technologies. However, utilizing the conditions described herein, one can selectively etch the dense, i.e., non-porous, low-k OSG hardmask selective to the underlying porous low-k OSG material effectively stopping on the latter. Thus, the subsequent application of the specifically tailored porous ILD etch chemistry to create the desire line structure will potentially result in a reduction in line height variations and line resistance variance, perhaps without the use of an ESL for the porous low-k material. This once more seemingly counterintuitive design will improve device performance (reduced $k_{eff}$) and functionality (uniform line heights).

Figure 3A:
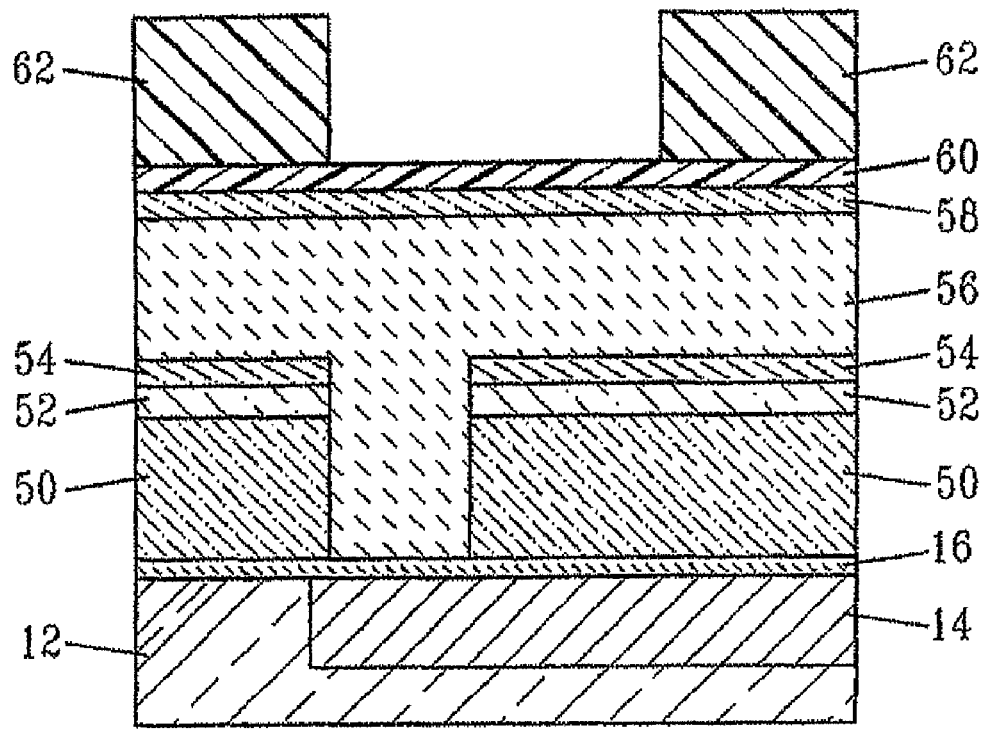
Figure 3B:
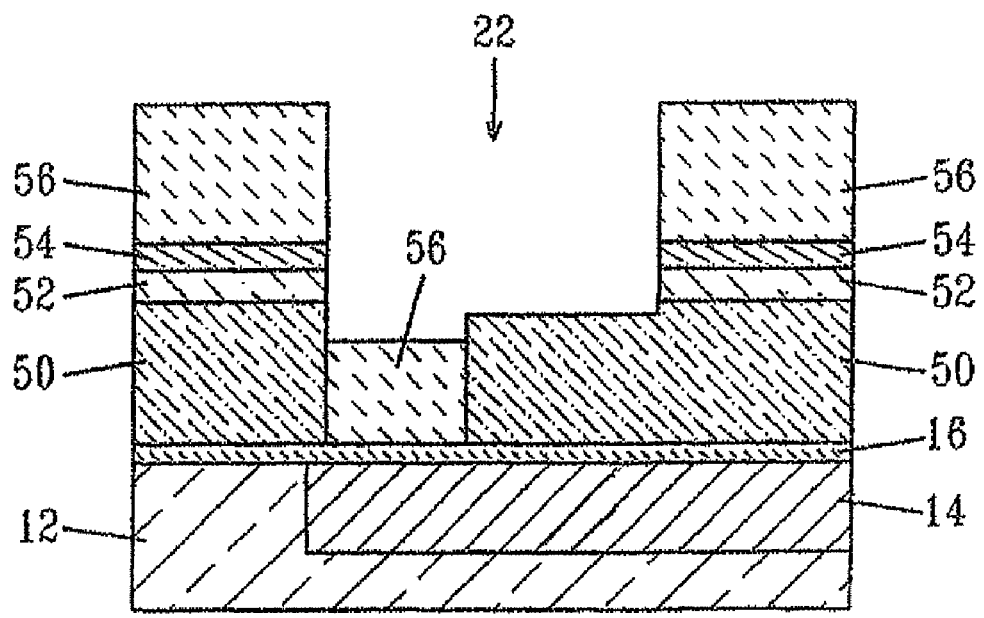

FIGS. 3A-3B illustrate the second embodiment in which a non-porous OSG hardmask is used as an etch stop for a porous OSG dielectric. In FIG. 3A, reference numeral 12 denotes a substrate and reference numeral 14 denotes a conductive region. The reference numerals are the same as described above in the first embodiment; therefore the materials and methods described above are applicable here as well. A dielectric cap 16 (see above definition and description) is then formed atop the exposed surfaces of substrate 12 and conductive region 14.

In the second embodiment, a porous OSG ILD 50 and a non-porous OSG hardmask 52 are then formed using the technique and materials described above in connection with OSG layers 18, 20 and 22. In the second embodiment, the porous OSG ILD 50 also has a carbon content that exceeds the non-porous OSG hardmask 52. In this embodiment, porous OSG ILD 50 is thicker than non-porous OSG hardmask 52. The thickness of the porous OSG ILD 50 is typically from about 60 to about 280 nm, while the thickness of the non-porous OSG hardmask 52 is from about 30 to about 50 nm.

Next, oxide hard mask 54 is formed atop the non-porous hardmask 52 and an opening that is filled with a planarizing dielectric 56 is then formed by lithography, etching and deposition. The etching step includes any conventional etching process. Note that the etching process mentioned above which includes the fluorocarbon-based plasma etch can also be employed at this point of the second embodiment of the present invention. The planarizing dielectric includes any material that can serve as a planarizing layer including for example, a non-photosensitive organic cross-linked polymer.

After forming the planarizing dielectric 56, an oxide cap 58 such as a low temperature oxide and an optional antireflective coating 60 are formed by known deposition methods. A patterned photoresist 62 containing a line pattern is formed by deposition and lithography. Several prior art etch processes are then used to etch layers 60, 58, and 56 which is subsequently followed by the inventive etch to process layers 54 and 52 selectively to layer 50. This latter etching process in a fluorocarbon-based plasma having a fluorine to carbon ratio and at an ion current that selectively etches the non-porous organosilicate glass hardmask relative to the porous organosilicate glass ILD (combined with the prior art processes aforementioned) are used to form the structure shown in FIG. 3B.

Figure 4A:
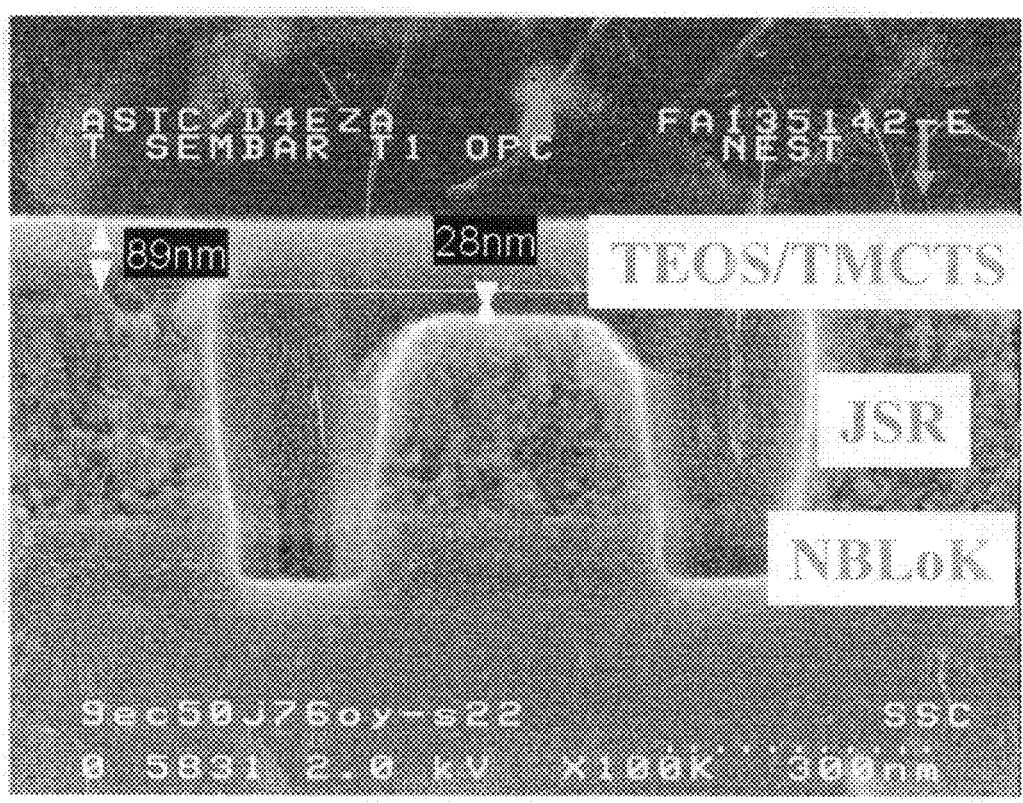
FIGS. 4A-4B are cross sectional scanning electron micrographs (SEMs) of various dual damascene interconnect structures built in a porous OSG dielectric with TEOS and SiCOH hardmask showing a 28 nm line height subsequent to 45 seconds of the inventive trench etch and a 41 nm line height subsequent to 60 seconds of the inventive trench etch, respectively.
Figure 4B:
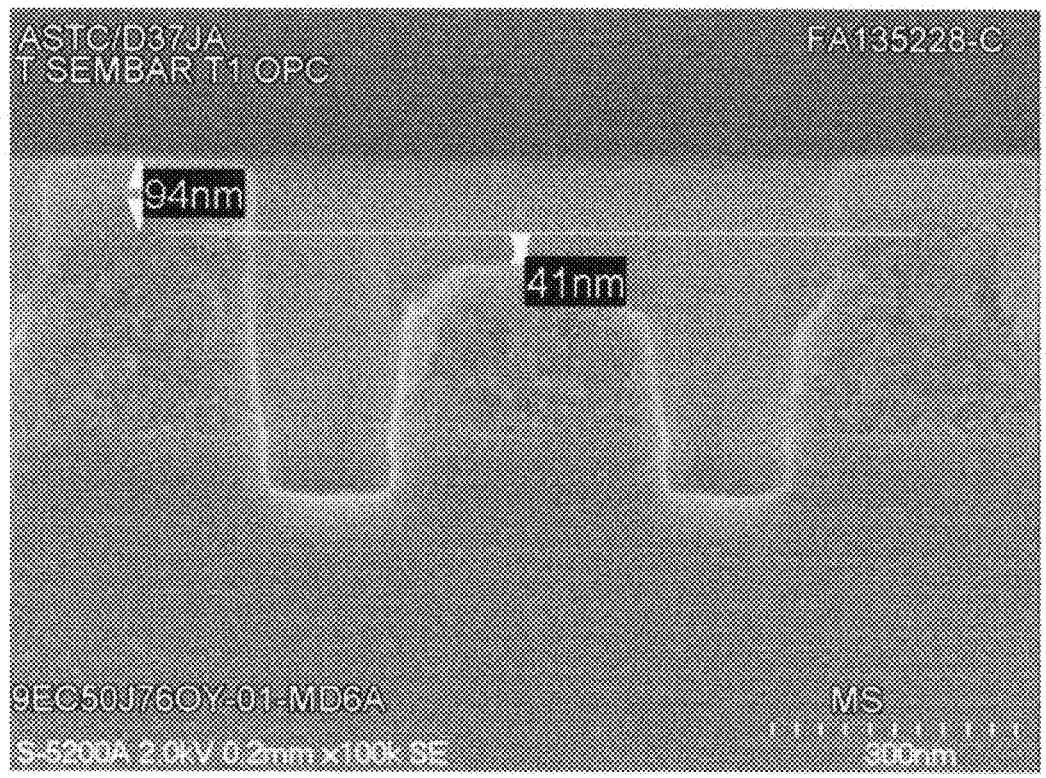

FIGS. 4A-4B actual cross sectional scanning electron micrographs (SEMs) of various dual damascene interconnect structures built in a porous OSG dielectric with TEOS and SiCOH hardmask showing a 28 nm line height subsequent to 45 seconds of the inventive trench etch and a 41 nm line height subsequent to 60 seconds of the inventive trench etch, respectively. These structures were formed utilizing the procedure described above in regard to the second embodiment of the present invention. The non-porous OSG ILD in this specific trench etch chemistry used to create these SEMs etched at a rate of ~4 nm/s. The two SEMs clearly illustrate that the porous OSG ILD etch rate in this specific etch chemistry is ~1 nm/s illustrating a selectivity of this chemistry of ~4:1 for the non-porous OSG ILD relative to its porous counterpart.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What we claim is:

1. A method of forming a pre-metallized interconnect structure comprising:

providing a structure comprising an etch stop layer comprising a porous organosilicated glass located between a first non-porous organosilicate glass interlevel dielectric and a second non-porous organosilicate glass interlevel dielectric, said porous organosilicate glass having a carbon content that is greater than the carbon content in the first and second non-porous organosilicate glass interlevel dielectrics; and patterning said structure to provide an opening that extends through the structure, said patterning comprising lithography and etching, wherein said etching is performed in a fluorocarbon-based plasma having a fluorine to carbon ratio and at an ion current that selectively etches the non-porous organosilicate glass interlevel dielectrics relative to the porous organosilicate glass, whereby a material of said second non-porous organosilicate glass interlevel dielectric is removed selective to said porous organosilicate glass during said etching through formation by said fluorine-based plasma of a SiC-like film that impedes further etching at a surface of said etch stop layer.

2. The method of claim 1 wherein said providing step comprising at least a deposition process in which a first precursor comprising atoms of Si, C, O and H is employed.

3. The method of claim 1 wherein said providing step further comprises a second precursor comprises C and H atoms, and optionally N, O and F.

4. The method of claim 1 wherein said fluorocarbon-based plasma comprises a mixture of $CF_4$ and $C_4F_8$, or other gases that contain fluorine and carbon.

5. The method of claim 1 wherein said fluorine:carbon ratio is from about 1.5:1 to about 4:1 and said ion current is from about 1 to about 20 (relative units); where 1 is defined as the threshold ion energy for ion enhanced (assisted) desorption (etching) of adsorbates from a dielectric surface to occur.

6. The method of claim 1 wherein said fluorocarbon-based plasma etch is performed at a pressure from about 40 mTorr to about 200 mTorr.

7. The method of claim 1, wherein said SiC-like film is derived from a portion of said etch stop layer by removal of all oxygen from said portion by said fluorocarbon-based plasma.

8. The method of claim 7, wherein said second non-porous organosilicate glass interlevel dielectric does not go through an etch-stop while said portion of said etch stop layer goes through an etch stop.

\* \* \* \* \*